United States Patent [19]

Matsuda et al.

[11] Patent Number: 5,801,880
[45] Date of Patent: Sep. 1, 1998

[54] CONFOCAL MICROSCOPE WITH OPTICAL RECORDING AND REPRODUCING APPARATUS

[75] Inventors: Osamu Matsuda; Masato Doi, both of Kanagawa, Japan

[73] Assignee: Sony Corporation, Tokyo, Japan

[21] Appl. No.: 532,037

[22] Filed: Sep. 21, 1995

[30] Foreign Application Priority Data

Sep. 21, 1994 [JP] Japan ..................... 6-227040

[51] Int. Cl.$^6$ .................. G01B 21/06; H01S 3/18
[52] U.S. Cl. ............... 359/385; 359/368; 372/43; 257/80
[58] Field of Search ............... 359/368–372, 359/385–389, 224–227; 372/45–46, 50; 257/80–86, 95, 443, 457; 369/102–112

[56] References Cited

U.S. PATENT DOCUMENTS

| | | | |
|---|---|---|---|
| 4,458,980 | 7/1984 | Ohki et al. ............... | 369/44.14 |
| 4,503,539 | 3/1985 | Mori et al. ............... | 372/45 |
| 4,736,231 | 4/1988 | Ayabe et al. ............. | 372/50 |
| 4,764,931 | 8/1988 | Matsuda ..................... | 372/29 |
| 5,012,477 | 4/1991 | Mesquida et al. ........ | 372/50 |
| 5,016,253 | 5/1991 | Kubota ....................... | 372/50 |
| 5,446,719 | 8/1995 | Yoshida et al. ........... | 369/122 |
| 5,479,426 | 12/1995 | Nakanishi et al. ......... | 372/50 |
| 5,598,394 | 1/1997 | Hibino et al. .............. | 369/109 |
| 5,606,181 | 2/1997 | Sakuma et al. ............ | 357/80 |
| 5,608,233 | 3/1997 | Sahara et al. .............. | 372/50 |

FOREIGN PATENT DOCUMENTS 0640962  3/1995  European Pat. Off. .

*Primary Examiner*—Thong Nguyen
*Attorney, Agent, or Firm*—Hill & Simpson

[57] ABSTRACT

A confocal scanning microscope can process two-dimensional or third-dimensional optical information at high speed and can be simplified in arrangement. The confocal scanning microscope includes an optical coupling device array composed of a plurality of optical coupling devices arranged on a common substrate in a one-dimensional or two-dimensional fashion, and an objective lens, wherein each of the optical coupling devices has light-emitting portion and a light-receiving portion closley disposed on the common substrate, and reflected-back light obtained from a target object after light emitted from the light-emitting portion has been reflected on the target object is received and detected near a confocal position by the light-receiving portion.

14 Claims, 19 Drawing Sheets

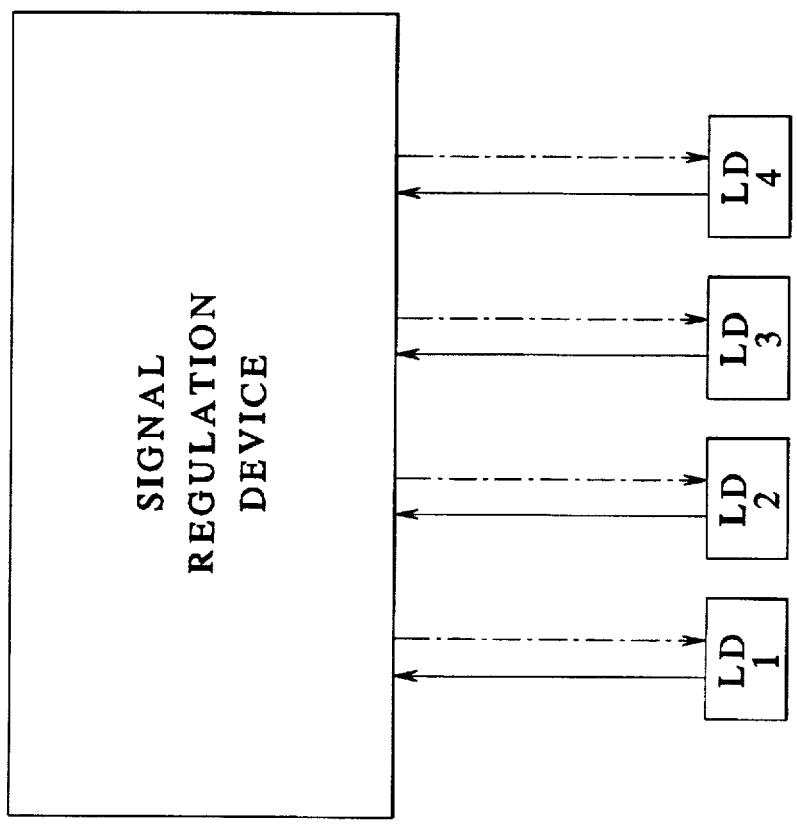

CONFOCAL MICROSCOPE WITH OPTICAL RECORDING AND REPRODUCING APPARATUS

FIELD OF THE INVENTION

The present invention relates to a confocal microscope capable of processing two-dimensional or three-dimensional optical information and an optical recording and reproducing apparatus.

BACKGROUND OF THE INVENTION

FIG. 1 of the accompanying drawings is a schematic diagram used to explain a principle of an optical system of a reflecting confocal scanning microscope which is often referred to as "CSM".

As shown in FIG. 1, in a reflection type confocal scanning microscope 1, light L from a point source (laser light source) 2 is reflected on a half mirror 3 and focused on a target object 5 set at the focus position by an objective lens 4. Reflected light reflected by the target object 5 is traveled through the objective lens 4 one more time and passed through the half mirror 3, whereafter it is detected by a point detector 6. In order to construct a confocal system, a point detector is placed at the position of a virtual image of the point source 2. Alternatively, a pinhole 7 is disposed as shown in FIG. 1 such that all rays of light passed through the pinhole 7 are detected by a surface detector (photo detector 6). Then, the target object 5 is microscopically scanned in a three-dimensional fashion and an image processing is carried out, thereby an image of a three-dimensional optical microscope image being obtained. Since the reflection type confocal scanning microscope 1 has the confocal optical system as described above, there can be obtained an image having remarkable characteristics, such as high contrast, having no coherent noise or having ultra-high resolution.

However, the confocal scanning microscope 1 is large in scale. Moreover, the confocal scanning microscope 1 typically requires significant time for measuring an object and has to process information of a large amount at high speed. As a consequence, the confocal scanning microscope is not suitable for handy measuring and cannot measure a target object which changes rapidly.

On the other hand, in an optical recording and reproducing apparatus for recording and reproducing an optical disk, such as a compact disc (CD), a write once compact disc (CD-R) or magneto-optical disk, an information processing speed, i.e., a transfer rate at which information is read and written is limited. Furthermore, since an information recording density is of a two-dimensional one, an amount of information is limited.

SUMMARY OF THE INVENTION

In view of the aforesaid aspect, it is an object of the present invention to provide a confocal microscope in which two-dimensional or three-dimensional optical information can be parallelly processed at high speed.

It is another object of the present invention to provide a confocal microscope which can be miniaturized.

It is still another object of the present invention to provide a confocal microscope which is high in reliability.

It is a further object of the present invention to provide a confocal microscope in which the number of optical assemblies can be lessened and in which an alignment required when optical assemblies are disposed can be made easy and stable.

It is yet a further object of the present invention to provide an optical recording and reproducing apparatus in which information can be processed at high speed and which can increase an amount of information in an optical recording medium.

It is still a further object of the present invention to provide an optical recording and reproducing apparatus which can be miniaturized and which is high in reliability.

According to an aspect of the present invention, there is provided a confocal microscope which is comprised of an optical coupling device array composed of a plurality of optical coupling devices arranged on a common substrate in a one-dimensional or two-dimensional fashion and an objective lens, wherein each of the optical coupling devices has a light-emitting portion and a light-receiving portion closely disposed on the common substrate, and reflected-back light obtained from a target object after light emitted from the light-emitting portion has been reflected on the target object is received and detected near a confocal position by the light-receiving portion.

According to another aspect of the present invention, there is provided an optical recording and reproducing apparatus which is comprised of an optical coupling device array composed of a plurality of optical coupling devices arranged on a common substrate in a one-dimensional or two-dimensional fashion, an objective lens, and an optical recording medium, wherein each of the optical coupling devices has a light-emitting portion and a light-receiving portion closely disposed on the common substrate, and reflected-back light obtained from the optical recording medium after light emitted from the light-emitting portion has been reflected on the optical recording medium is received and detected near a confocal position by the light-receiving portion.

BRIEF DESCRIPTION OF THE DRAWINGS

FIG. 19 is a block diagram illustrating subjecting adjacent optical coupling devices in an array to different signal regulation thereby to reduce cross-talk between adjacent coupling devices.

DETAILED DESCRIPTION OF THE INVENTION

Figure 1:
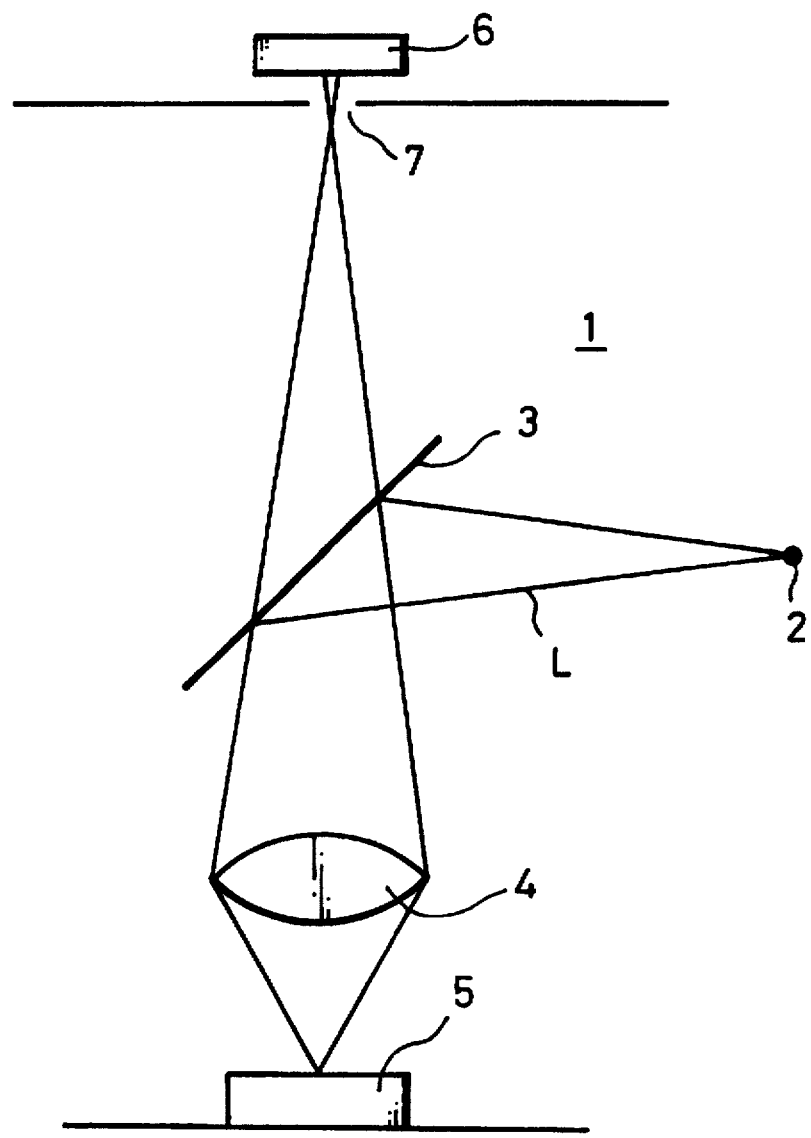
FIG. 1 is a schematic diagram used to explain a principle of an optical system of a confocal scanning microscope.
Figure 2:
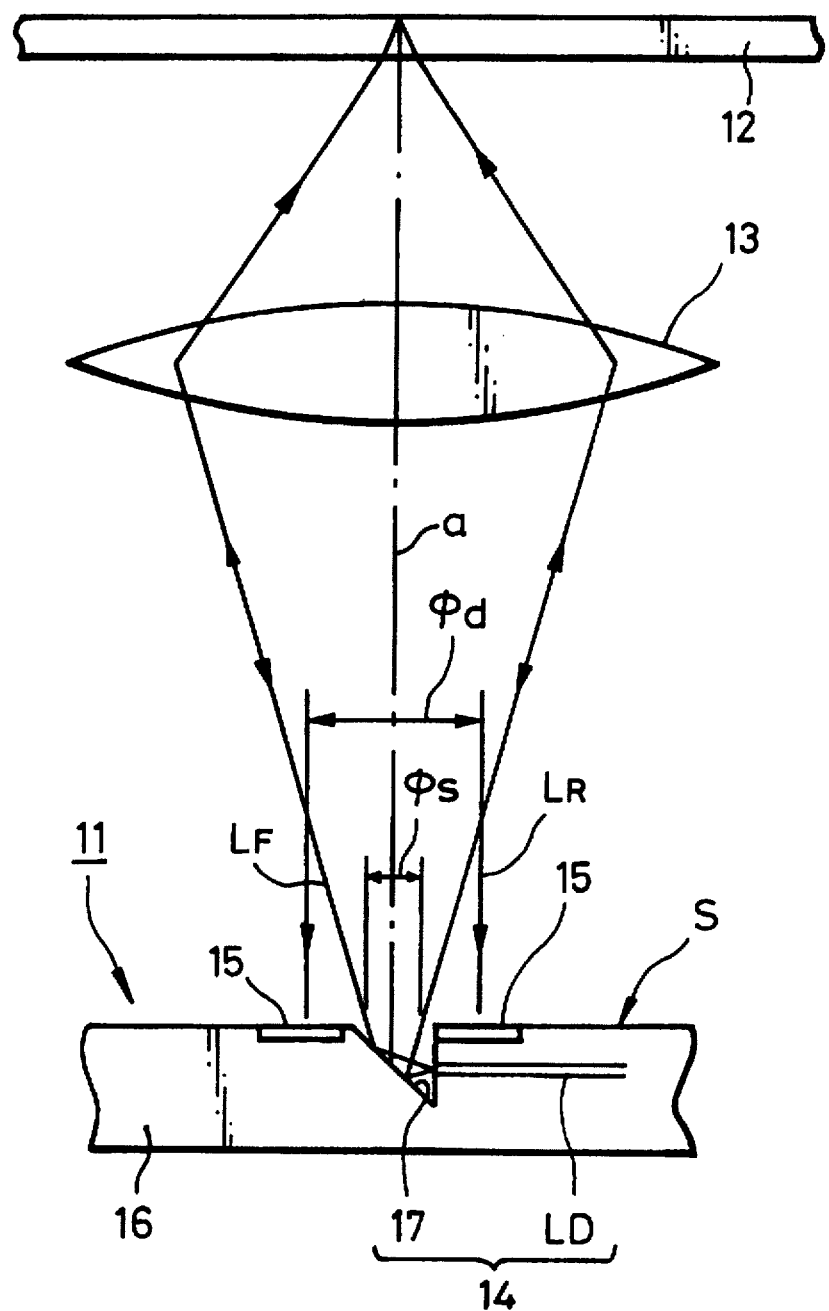
FIG. 2 is a schematic diagram used to explain an optical device according to the present invention.

The present invention will now be described with reference to the drawings. A novel optical coupling device (referred to hereinafter as "optical device"), i.e., confocal laser coupler (CLC) device in accordance with the present invention will be described with reference to FIGS. 2 to 4. In FIG. 2, reference numeral 11 denotes an optical device, 12 an irradiated portion and 13 a converging means, i.e., condenser optical lens.

As shown in FIG. 2, the optical device 11 is composed of a light-emitting portion 14 and a light-receiving portion 15 and a common semiconductor substrate 16 on which the light-emitting portion 14 and the light-receiving portion 15 are integrally formed. Light LF emitted from the light-emitting portion 14 is converged and irradiated on the irradiated portion 12. Returning light or reflected-back light LR reflected on the irradiated portion 12 is converged by the converging means 13 and received by the light-receiving portion 15 located at the confocal position (strictly speaking, position near the confocal position) of the converging means 13. With the above-mentioned arrangement, before and after light emitted from the light-emitting portion 14 is reflected on the irradiated portion 12, light emitted from the light-emitting portion 14 is passed through the optical paths of the same axis and received by the light-receiving portion 15 as the optical axis thereof is shown by a one-dot chain line a.

Figure 3:
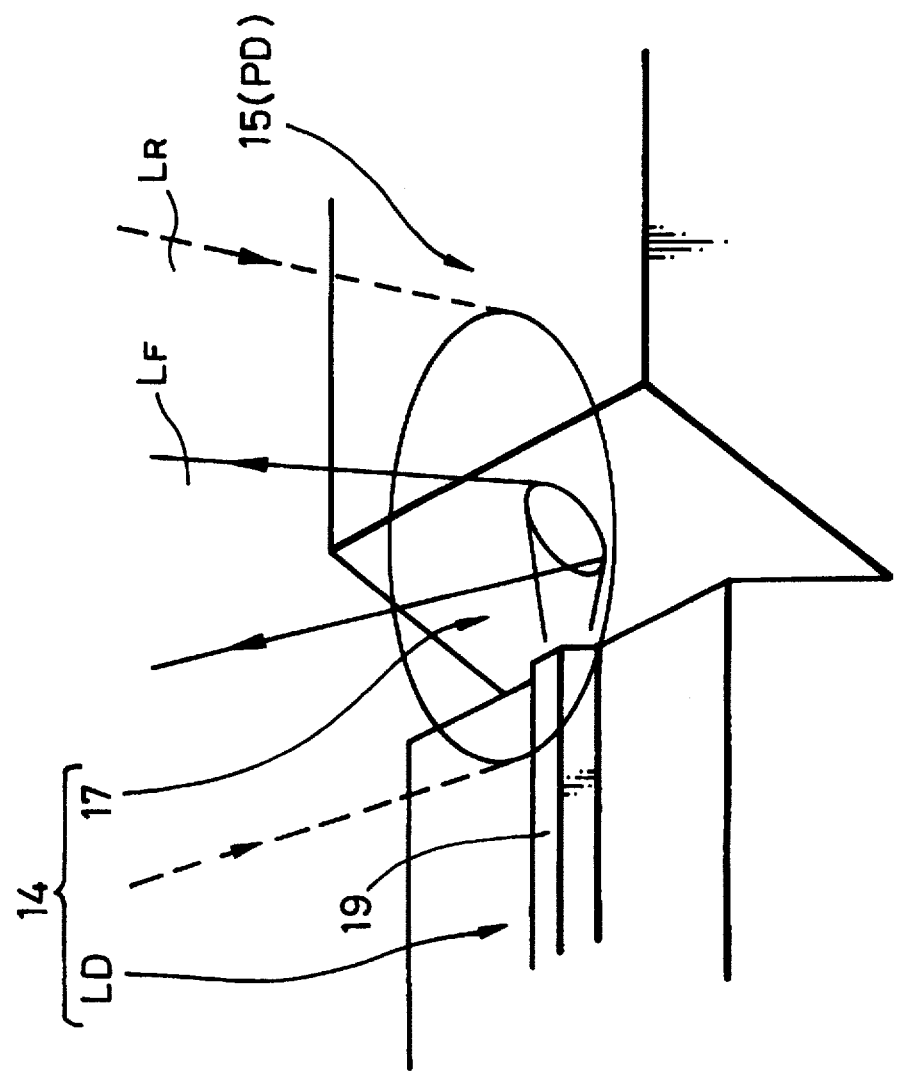
FIG. 3 is a perspective view showing a main portion of the optical device shown in FIG. 2 in an enlarged scale.

As FIG. 3 shows in an enlarged scale, in the optical device 11, the light-emitting portion 14 is composed of a semiconductor laser LD (having a stripe electrode 19) having a horizontal resonator and a reflecting mirror 17. The light-receiving portion 15 is formed of a photodiode (PD). The semiconductor laser LD emitted light $L_F$ is reflected by the reflecting mirror 17 so that an optical axis of light $L_F$ becomes aligned with the optical path extended toward the irradiated portion 12.

Reflected-back light $L_R$ traveling toward the light receiving portion 15 is converged near a light diffraction limit (i.e., diffraction limit of lens). The light-receiving portion 15 is located such that at least a part of light-receiving surface thereof is located within this light diffraction limit, i.e., at the position wherein a distance of light emitted from the light-emitting portion 14 intersecting the light-receiving surface layout reference plane S to the optical axis a falls within 1.22 $\lambda$/NA where $\lambda$ is the wavelength of light emitted from the light-emitting portion 14 and NA is the numerical aperture of the converging means 13.

Figure 4:
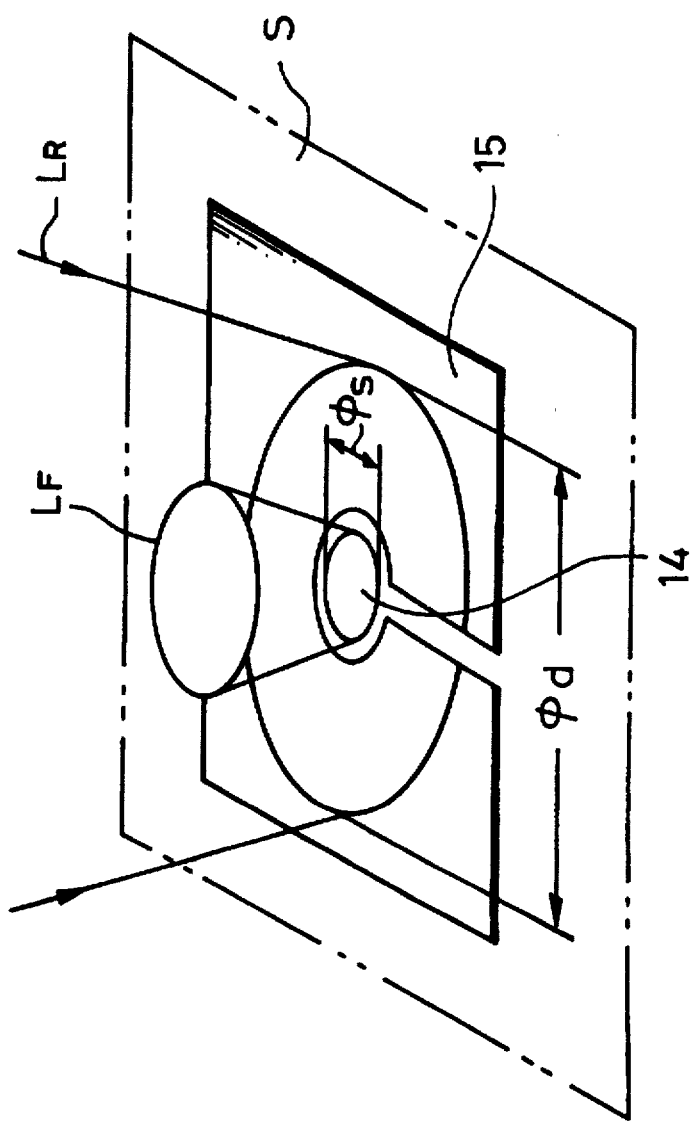
FIG. 4 is a perspective view used to explain an optical device.

In this case, as shown in FIGS. 2 and 4, a diameter $\phi_s$ of light $L_F$ emitted from the light-emitting portion 14 and which is obtained on the layout reference plane S of the light-receiving surface of the light-emitting portion 15 is selected to be smaller than a diameter $\phi_d$ of the light diffraction limit. Moreover, the effective light-receiving surface of the light-receiving portion 15 is located outside the diameter $\phi_s$ of emitted light $L_F$. If a semiconductor laser is used as a light source of the light-emitting portion 14, then the diameter $\phi_s$ of emitted light $L_F$ can fall in a range of about 1 to 2 μm. On the other hand, if the numerical aperture NA of the converging means 13 is selected in a range of from 0.09 to 0.1 on the optical device 11 side and the wavelength $\lambda$ of emitted light is selected to be about 780nm, then the diffraction limit, i.e., the diameter $\phi_d$ is substantially expressed as 1.22 $\lambda$/NA=10 μm.

The light-emitting portion 14 is disposed at one focus position of the converging means 13 and the irradiated portion 12 is disposed at the confocal position. Laser light emitted from the semiconductor laser LD of the light-emitting portion 14 is reflected by the reflecting mirror 17 in substantially the vertical direction and irradiated on the irradiated portion 12 through the converging means 13. When properly focused, reflected-back light reflected from the irradiated portion 12, i.e., reflected-back light LR including information of the irradiated portion 12 is returned through the same optical path, converged again by the converging means 13 and introduced into the photodiode PD of the light-receiving portion 15 disposed near the confocal position, whereafter reflected-back light LR is received and detected by the light-receiving portion 15, i.e., converted into an electrical signal and then output.

A typical example of a method of fabricating the optical device 11 will be described with reference to FIGS. 5A through 5F.

Figure 5A:
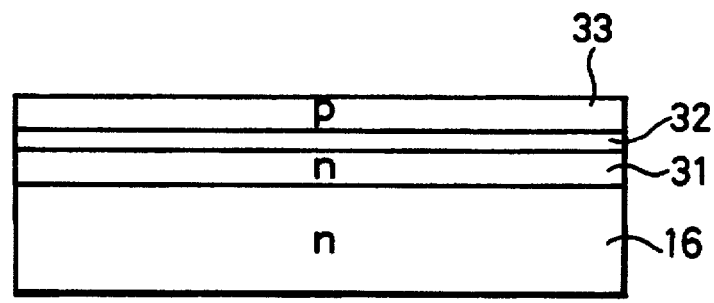
FIGS. 5A-5F show steps of a method of fabricating an optical device according to the present invention.

As shown in FIG. 5A, semiconductor layers forming a semiconductor laser are epitaxially grown on a GaAs semiconductor substrate 16 of first conductivity type, e.g., n type whose major surface is (100) crystal plane. Specifically, there is formed a laminated semiconductor layer wherein a first cladding layer 31 formed of AlGaAs layer of the same conductivity type as that of the GaAs semiconductor substrate 16, a GaAs active layer 32 and a second cladding layer 33 formed of AlGaAs layer of conductivity type different from that of the first cladding layer 31, e.g., p type are epitaxially grown on the GaAs semiconductor substrate 16, in that order, by a suitable method, such as MOCVD (metal organic chemical vapor deposition).

Figure 5B:
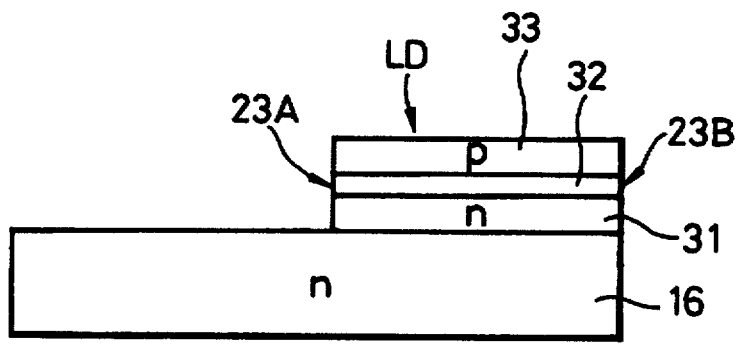

As shown in FIG. 5B, a part of the semiconductor layers 33, 32, 31 thus epitaxially grown on the semiconductor substrate 16 is left as the semiconductor laser LD and at least a portion where the reflecting mirror 17 is finally formed is etched away by a suitable method, such as RIE (reactive ion etching). Respective end faces formed on the semiconductor layer by the etching faces are employed as resonator end faces 23A, 23B. A horizontal resonator of the semiconductor laser LD is formed between the two end faces 23A and 23B. In this case, current blocking regions are formed so as to sandwich a region where the horizontal resonator of the semiconductor laser LD is finally formed by ion implantation of impurity.

Figure 5C:
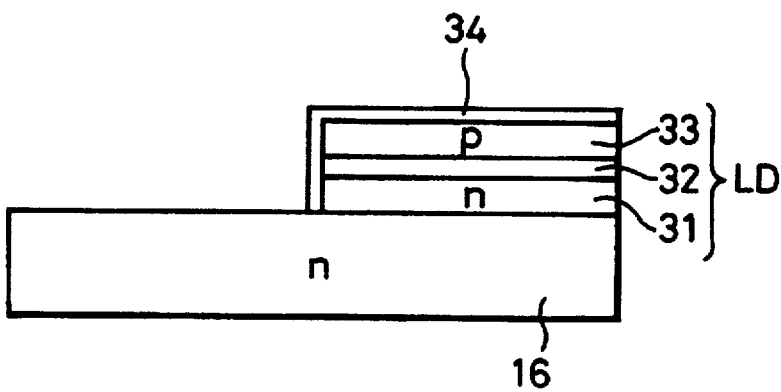

Then, as shown in FIG. 5C, a mask layer 34, e.g., insulating layer such as $SiO_2$ or SiN is deposited on the second cladding layer 33 so as to cover the laminated semiconductor layer left on the semiconductor substrate 16, i.e., the portion in which the semiconductor laser LD is formed by selective MOCVD.

Figure 5D:
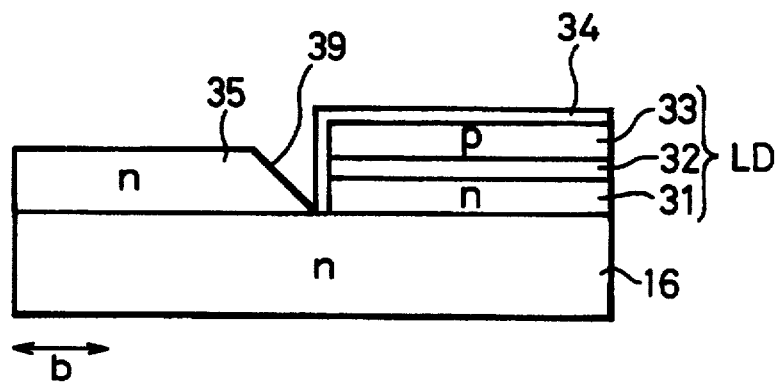

As shown in FIG. 5D, a first conductivity type, e.g., n-type GaAs first semiconductor layer 35 is formed on the semiconductor substrate 16 at its portion which is not covered with the mask layer 34 by selective MOCVD.

Figure 5E:
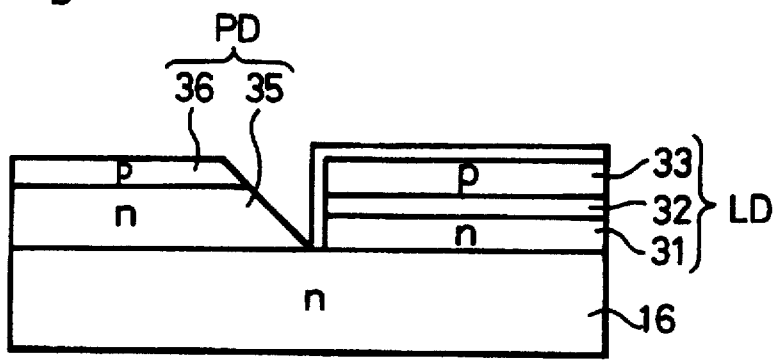

Subsequently, as shown in FIG. 5E, a second conductivity type, e.g., p-type GaAs second semiconductor layer 36 is formed on the first semiconductor layer 35 by selective MOCVD. The first and second semiconductor layers 35 and 36 constitute the photodiode PD.

Figure 5F:
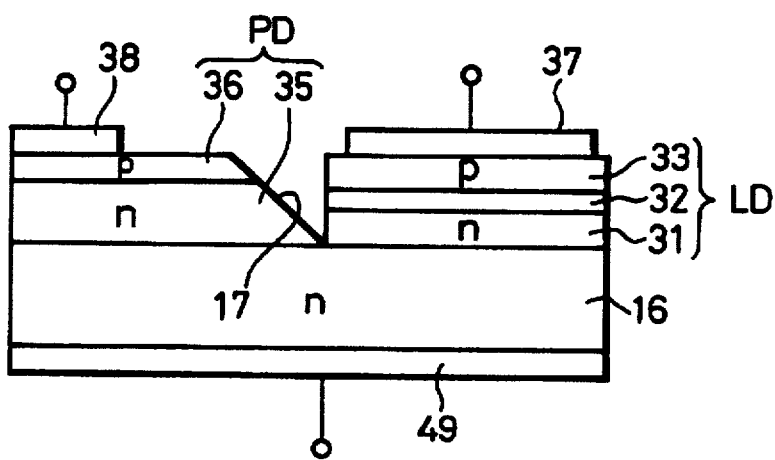

Then, as shown in FIG. 5F, the mask layer 34 is removed by etching and electrodes 37 and 38 of the semiconductor laser LD and the photodiode PD are deposited on the semiconductor laser LD and a part of the second semiconductor layer 36 to make an ohmic contact. A common electrode 49 is deposited on the rear surface of the semiconductor substrate 16 to make an ohmic contact.

The end face 39 of the semiconductor layer epitaxially grown on the semiconductor substrate 16 by MOCVD as shown in FIG. 5D, in this embodiment, the first semiconductor layer 35 and which opposes the resonator end face 23A becomes a specified crystal plane. For example, if the resonator length direction of the horizontal resonator of the semiconductor laser formed between the semiconductor laser end faces 23A and 23B, i.e., arrow b direction shown in FIG. 5D is taken as [011] crystal axis direction, then the opposing plane 39 is produced as a {111} A inclined plane. If the arrow b direction is taken as a [0–11] crystal axis direction, then the opposing plane 39 is produced as a {111} B inclined plane. In any cases, an angle formed by the opposing plane 39 relative to the plate surface of the semiconductor substrate 16 becomes 54.7°. Also, if the arrow b direction is taken as [100] crystal axis direction, then the opposing plane 39 is produced as a {110} inclined plane at an angle of 45° relative to the plate surface of the semiconductor substrate 16. In any cases, the opposing plane 39 is formed of an atomic plane with a satisfactory morphology.

Therefore, the inclined plane 39 based on the specified crystal plane can be used as the reflecting mirror 17 which can reflect emitted light LF from the end face 23A of the horizontal resonator of the semiconductor laser LD in a predetermined direction. According to the above-mentioned arrangement, since the reflecting mirror 17 is formed of the crystal plane, the reflecting mirror 17 is excellent in mirror property and the inclination angle thereof can be set accurately.

The photodiode PD can also be formed on the semiconductor laser LD side, though not shown.

Figure 6:
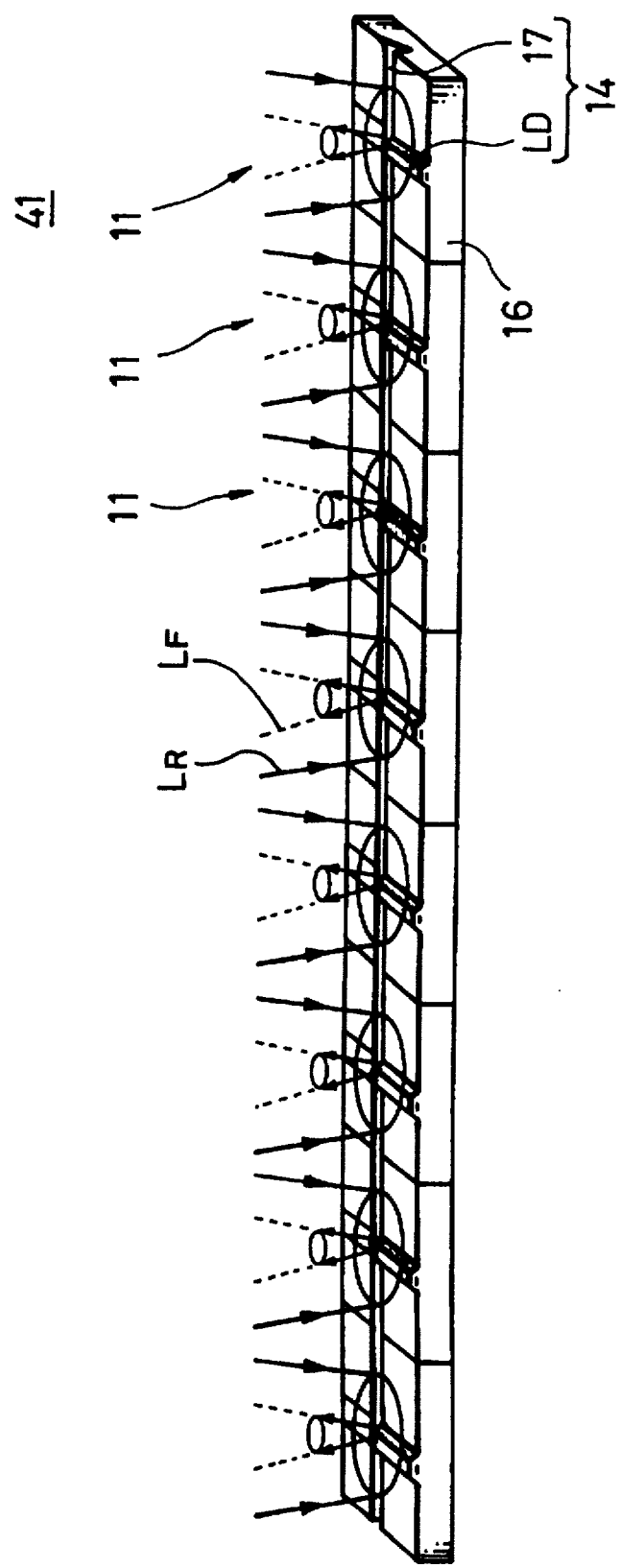
FIG. 6 is a perspective view showing an arrangement of a one-dimensional optical device array used in the present invention.
Figure 7:
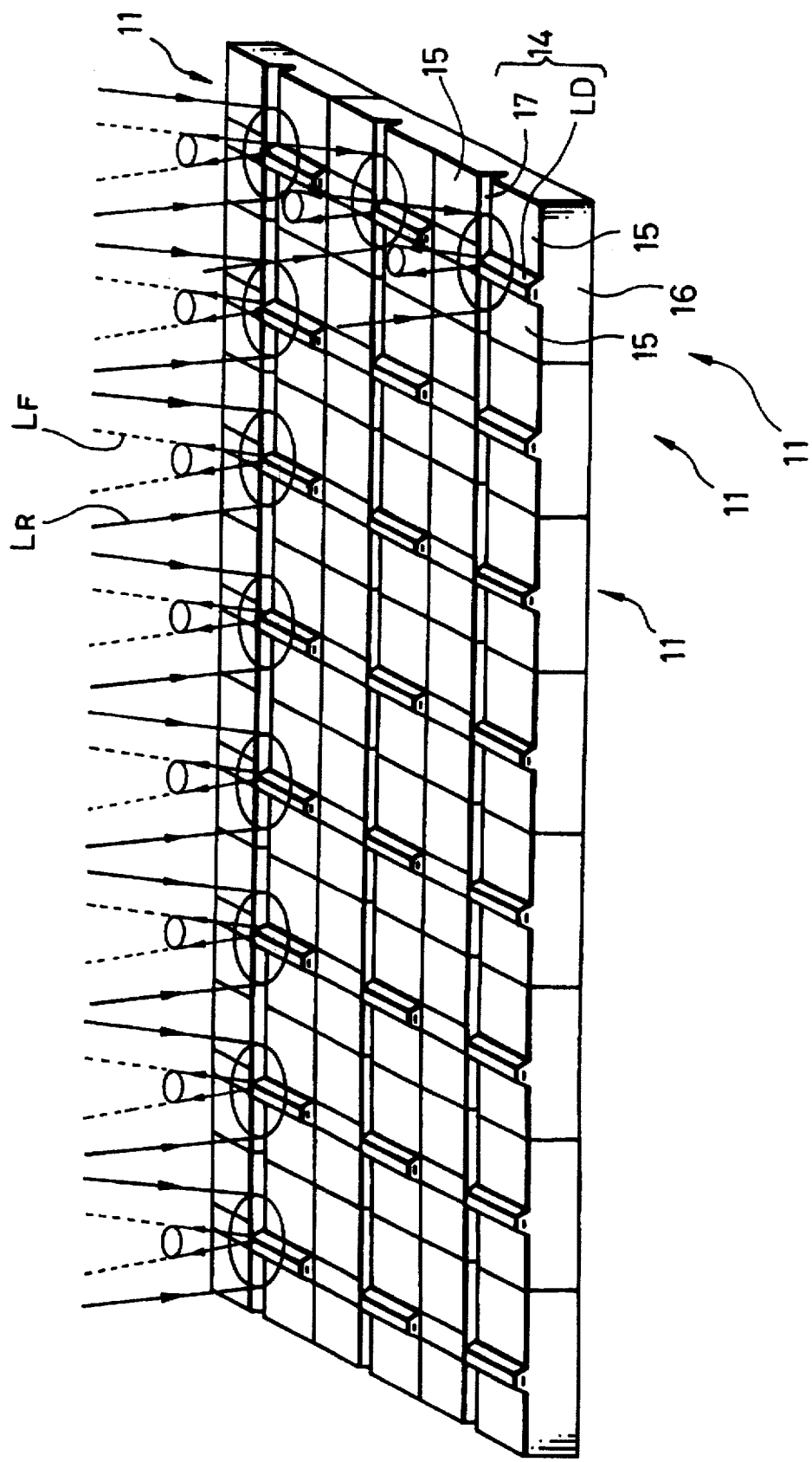
FIG. 7 is a perspective view showing an arrangement of a two-dimensional optical device array used in the present invention.

According to this embodiment, as shown in FIG. 6 or 7, a one-dimensional optical device array (i.e., one-dimensional optical coupling device array) or two-dimensional optical device array (i.e., two-dimensional optical coupling array) 42 is arranged 15 by forming a plurality of optical devices 11 monolithically on the common semiconductor substrate 16 so as to be arrayed in a one-dimensional or two-dimensional fashion.

Figure 8:
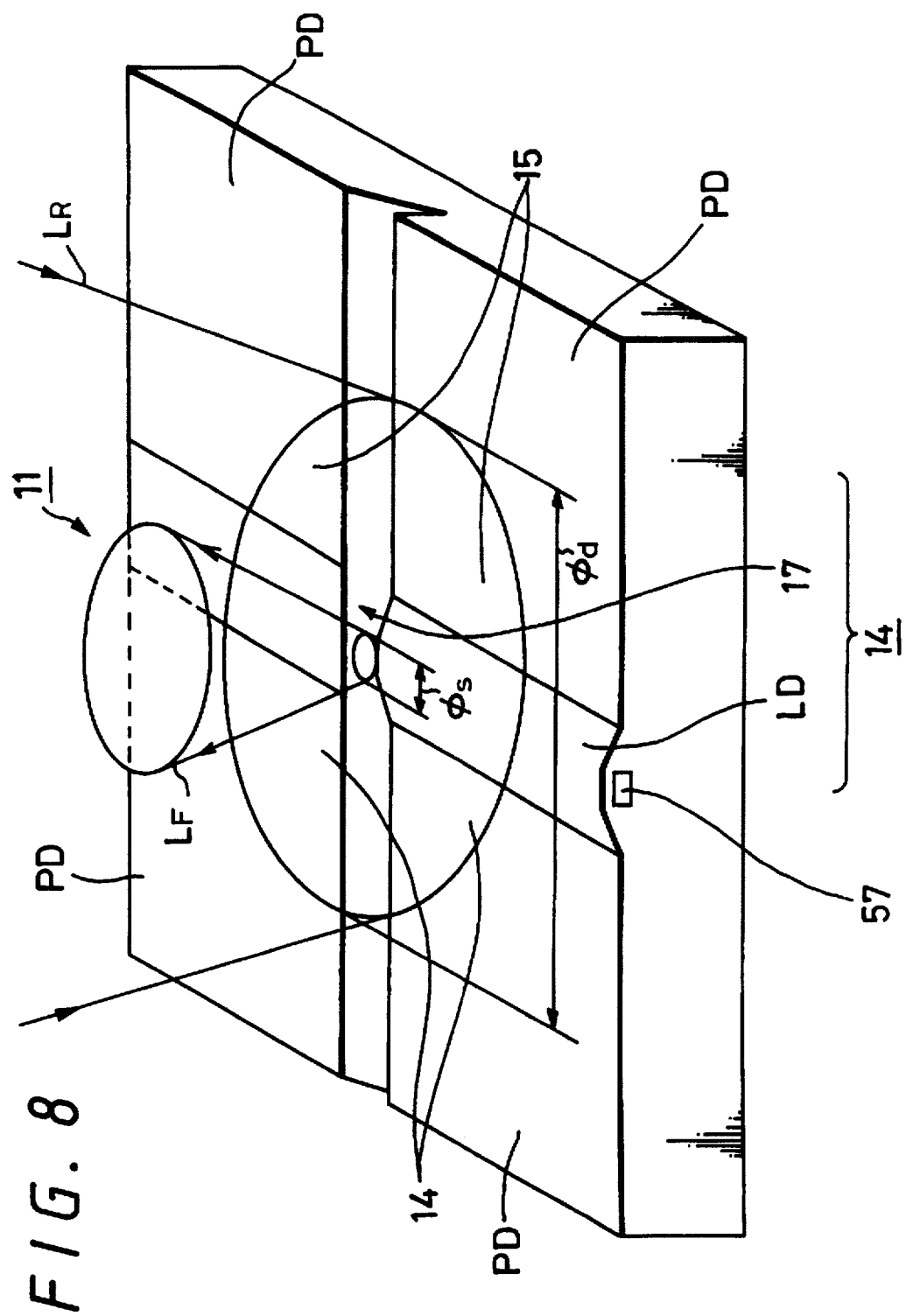
FIG. 8 is a perspective view showing an example of an optical device for constructing the one-dimensional or two-dimensional optical device array.

In this case, the optical device 11 forming the one-dimensional optical device array 41 or two-dimensional optical device array 42 shown in FIG. 6 or 7 is composed, as shown in FIG. 8, the semiconductor laser LD of so-called ridge-shaped SDH structure forming the light-emitting portion 14, the reflecting mirror 17 opposed to the light emitting end face of the horizontal resonator formed of the active layer 57, the reflecting mirror 17 reflecting emitted light LF from the semiconductor laser LD in the direction toward the irradiated portion (not shown) and quadrant photodiodes PD disposed around the reflecting mirror 17.

The one-dimensional optical device array 41 and the two-dimensional optical device array 42 can be manufactured very precisely with high density by use of the aforesaid manufacturing method shown in FIGS. 5A through 5F.

While each optical device 11 forming the one-dimensional or two-dimensional optical device array 41 or 42 uses the reflecting mirror 17 of 45° to effect vertical radiation, the present invention is not limited thereto and the reflecting mirror 17 of 54.7° can be used. Alternatively, if the stripe direction of the semiconductor 10 laser LD is changed or the arrow b direction of the semiconductor substrate 16 is deviated from the [100] crystal axis direction, then it is possible to form the reflecting mirror 17 with an arbitrary angle. Therefore, as shown in FIG. 9, the optical device 11 can take an arbitrary optical axis angle.

Figure 9:
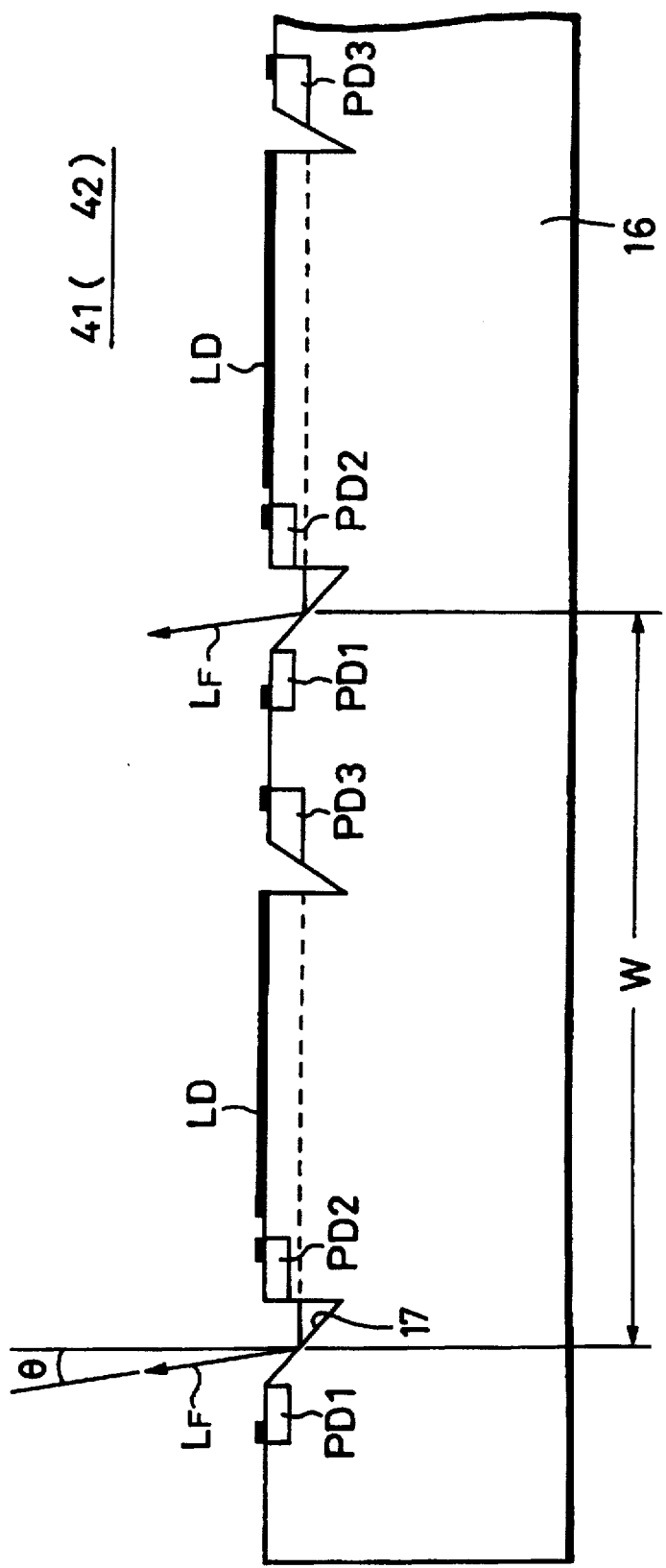
FIG. 9 is a side view showing a main portion of another example of a one-dimensional or two-dimensional optical device array.

In FIG. 9, reference letters PD1, PD2 depict photodiodes of the light-receiving portion 15 and PD3 a photodiode for monitoring a laser output of the semiconductor laser LD. Moreover, also in the optical device 11 including the reflecting mirror 17 with an angle of 45°, the whole of the optical device 11 can be inclined and tilted in a range of wide angle of light.

Figure 10:
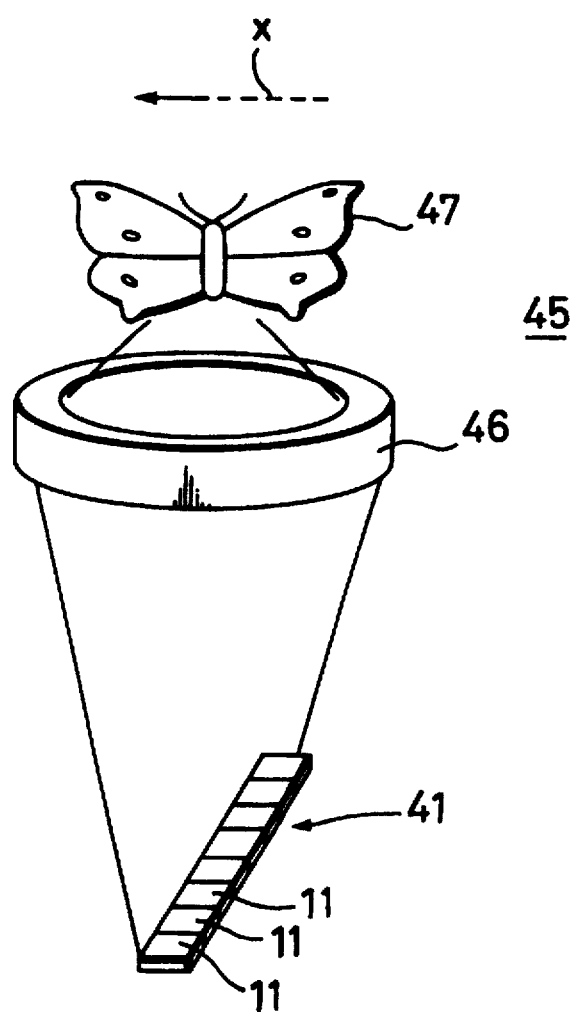
FIG. 10 is a perspective view showing a confocal microscope according to a first embodiment of the present invention.

FIG. 10 shows in perspective view form a confocal scanning microscope according to a first embodiment of the present invention. As shown in FIG. 10, a confocal scanning microscope 45 according to this embodiment is composed of the one-dimensional optical device array 41 shown in FIG. 6 and an objective lens 46, the one-dimensional optical device array 41 being disposed at a right angle with respect to a scanning direction x of the irradiated portion, i.e., target object 47. In this case, laser light from each optical device 11 constructing the one-dimensional optical device array 41 is irradiated at a right angle by the 45° reflecting mirror 17. A spacing (see a spacing W in FIG. 9) between the two optical devices 11 of the one-dimensional optical device array 41 can be selected to be about 500 μm.

According to the confocal scanning microscope 45, when the confocal scanning microscope 45 and the target object 47 are scanned relatively, e.g., the target object 47 is scanned in the direction shown by an arrow x in FIG. 10, normal CSM (confocal -scanning microscope) signals of the number corresponding to the number of optical devices can be obtained parallelly by detected signals from the light-receiving portions 15 of the respective optical devices 11. In other words, a speed whereat information is read out can be increased by the amount corresponding to the number of the optical devices 11 by subdividing the optical device 11 within the one-dimensional optical device array 41.

Inasmuch as reflected-back light reflected on the de-focus portion has a large spot size on the light-receiving portion 15, there is then the possibility that this reflected-back light will be received by the adjacent optical device 11, i.e., a crosstalk of a signal from the adjacent optical device 11 will occur. Such crosstalk contributes to the confocal scanning microscope 45 as a very small noise ($<10^{-4}$). If the aforesaid crosstalk becomes a serious problem, then adjacent signals are pulse-modulated and discriminated from each other based on a phase difference, thereby preventing a crosstalk from occurring.

As other method of reducing a crosstalk, there is a method wherein polarizing directions of the semiconductor lasers LD are crossed each other between the adjacent optical devices 11 to cause the surface of the photodiode of the light-receiving portion to have a polarizing property, i.e., array is formed by alternately arranging the optical device 11 whose polarizing direction of laser light is the horizontal direction and the optical device 11 whose polarizing direction of laser light is the vertical direction and a polarization selection film which passes only light of corresponding polarizing direction is formed on the surface of the light-receiving portion 15 of each optical device 11. A distance between the optical devices 11 falls in an allowance range of aberration of optical system.

The different signal regulation of the optical coupling device to reduce cross talk as described above is illustrated in block diagram form in FIG. 19. As illustrated, laser coupling devices LD1–LD4 receive differently regulated signals from a signal regulation device. Signals generated by the laser coupling devices are then discriminated by the signal regulator, be it based on, e.g., film width modulation, light polarization, etc.

Figure 11:
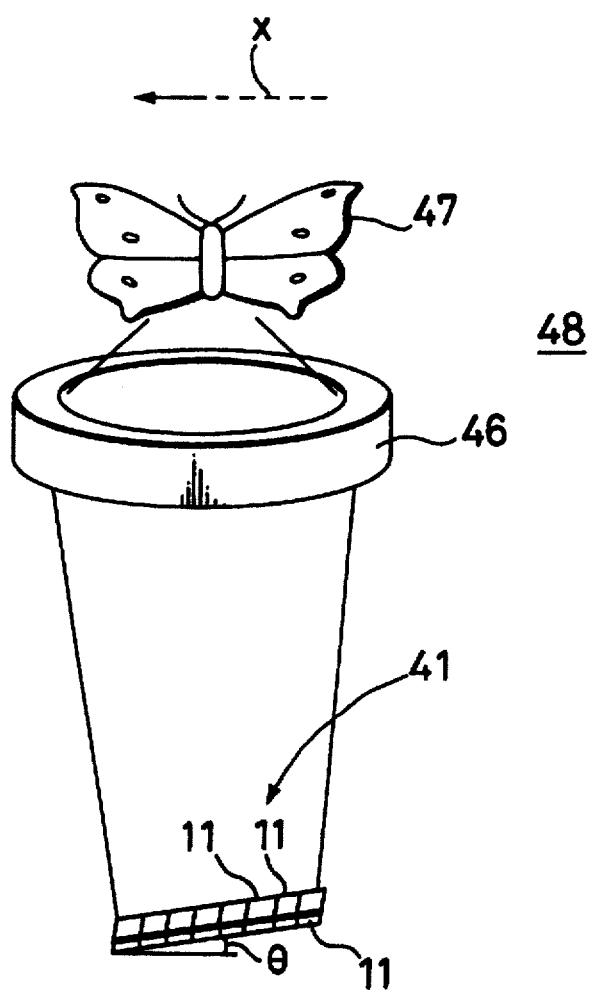
FIG. 11 is a perspective view showing a confocal microscope according to a second embodiment of the present invention.

FIG. 11 shows a confocal scanning microscope according to a second embodiment of the present invention. The confocal scanning microscope 48 according to the second embodiment includes the one-dimensional optical device array (45° reflecting mirror reflects laser light in the vertical direction) 41 shown in FIG. 6 and the objective lens 46. The one-dimensional optical device array 41 is disposed in parallel to the scanning direction x of the target object 47. Also, the whole of the one-dimensional optical device array 41 is inclined with a predetermined angle θ along the scanning direction x, i.e., optical axis reflected in the vertical direction by the reflecting mirror 17 is tilted by an angle θ (e.g., θ=5°) relative to the optical axis of the objective lens 46.

According to the confocal scanning microscope 48, when the target object 47 is scanned relatively, information at different positions in the depth direction in the target object 47, i.e., information of the number corresponding to the number of optical devices can be obtained parallelly by detected signals from the light-receiving portions 15 of the optical devices 11 of the one-dimensional optical device array 41. In this case, the spacing W of the optical devices 11 of the one-dimensional optical device array 41 and the inclination angle θ (see FIG. 9) of the one-dimensional optical device array 41 can provide a distance difference of Wtanθ in the depth direction with the result that three-dimensional direction information can be obtained.

Specifically, a distance between each optical device 11 and the objective lens 46 is displaced relative to the common objective lens 46 by tilting the one-dimensional optical device array 41 by the angle θ, whereby a focus position of light from each optical device 11 is shifted. A depth of focus is very small so that information obtained at respective focus positions of the optical devices 11, accordingly, at different positions in the depth direction of the target object 47 can be read out from each optical device 11. Then, since the target object 47 is relatively scanned in a two-dimensional fashion under the condition that the one-dimensional optical device array 41 is tilted, information of sectional surfaces corresponding to the number of optical elements forming the optical device 11 can be obtained parallelly. As a result, three-dimensional information can be obtained. In this case, the crosstalk can be canceled out or neglected similarly as described above.

Figure 12:
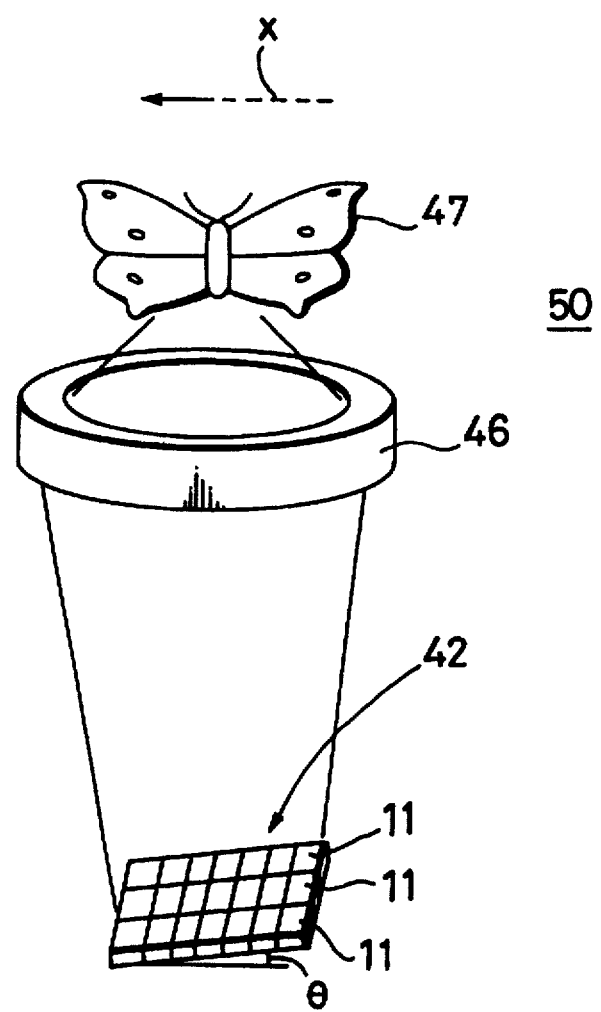
FIG. 12 is a perspective view showing a confocal microscope according to a third embodiment of the present invention.

FIG. 12 shows a confocal scanning microscope using the two-dimensional optical device array according to a third embodiment of the present invention.

As shown in FIG. 12, a confocal scanning microscope 50 according to this embodiment includes the two-dimensional optical device array (45° reflecting mirror 17 reflects laser light in the vertical direction) 42 shown in FIG. 7 and the objective lens 46. The two-dimensional optical device array 42 is disposed such that one arrangement direction of the optical device 11 is extended along the scanning direction x of the target object 47. Moreover, the whole of the two-dimensional optical device array 42 is tilted at a predetermined angle θ along the scanning direction x of the target object 47, i.e., the optical axis reflected in the vertical direction by the reflecting mirror 17 is tilted at an angle θ (e.g., θ=5° relative to the optical axis of the objective lens 46.

According to the above-mentioned confocal scanning microscope 50, when the target object 47 is scanned relatively, information in FIGS. 10 and 11 can be obtained simultaneously parallelly and three-dimensional information can be obtained. Therefore, when the two-dimensional optical device array 42 is used, it becomes possible to process information at higher speed. If recent high-speed computers are disposed in parallel to each other, then this kind of mass-storage information processing can be carried out with ease.

In FIG. 12, if the two-dimensional optical device array is not tilted but disposed horizontally, then two-dimensional information can be obtained simultaneously. Accordingly, it becomes possible to process information at higher speed as compared with the confocal scanning microscope 45 shown in FIG. 10.

Figure 13:
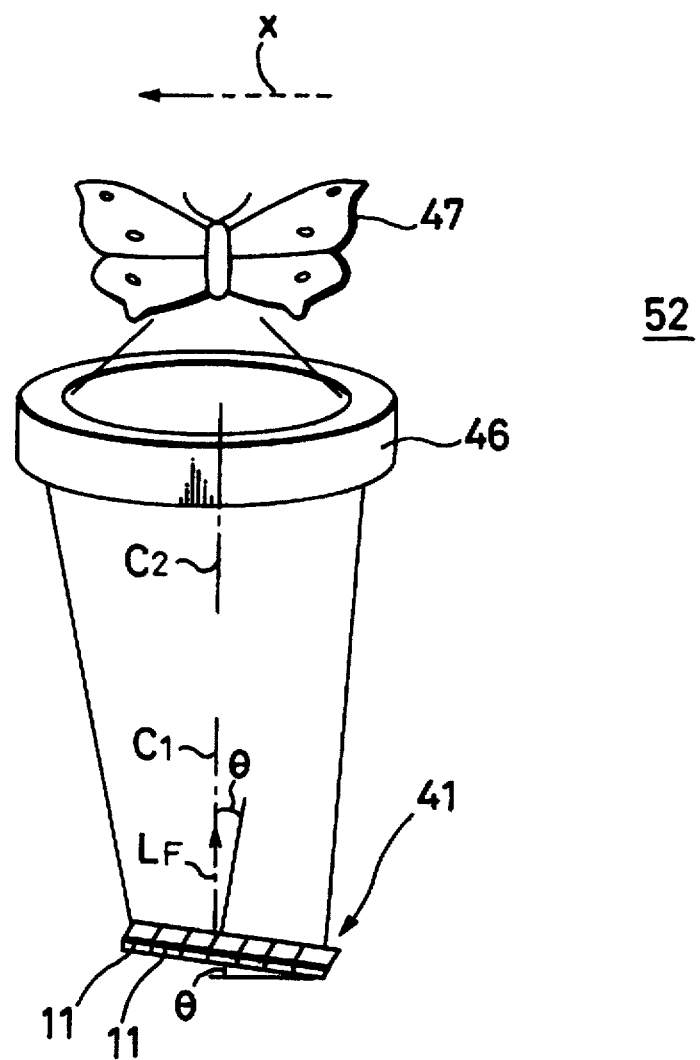
FIG. 13 is a perspective view showing a confocal microscope according to a fourth embodiment of the present invention.

FIG. 13 shows a confocal scanning microscope using the one-dimensional optical device array according to a fourth embodiment of the present invention. As shown in FIG. 13, in a confocal scanning microscope 52 according to this embodiment, the array shown in FIG. 9, i.e., the one-dimensional optical device array 41 arranged such that emitted light LF reflected on the reflecting mirror 17 is irradiated with an inclination angle of θ with respect to the vertical direction is disposed such that an optical axis $C_1$ of emitted light LF of the optical device 11 coincides with an optical axis $C_2$ of the objective lens 46.

According to this confocal scanning microscope 52, inasmuch as the optical axis $C_1$ of emitted light LF of the one-dimensional optical device array 41 coincides with the optical axis $C_2$ of the objective lens 46, it is possible to prevent a coupling efficiency of the objective lens 46 and emitted light $L_F$ from being lowered when the optical axis $C_1$ of emitted light $L_F$ and the optical axis $C_2$ of the objective lens 46 are not agreed with each other. Thus, it is possible to obtain more reliable three-dimensional information.

If the confocal scanning microscope using the two-dimensional optical device array 42 uses the two-dimensional optical device array 42 shown in FIG. 9 similarly to FIG. 13, then the optical axis $C_1$ of the emitted light $L_F$ and the optical axis $C_2$ of the objective lens 46 can coincide with each other.

While the objective lens 46 is integrally formed with the condenser lens for focusing emitted light on the optical device 11 as described above, the present invention is not limited thereto and a variety of lens arrangements, such as to provide another condenser lens can be made.

According to the confocal scanning microscope, it is possible to process two-dimensional information or three-dimensional information at high speed parallelly. Moreover, since the optical device array 41 or 42 formed of the optical device 11 wherein the light-emitting portion 14 and the light-receiving portion 15 are integrally formed is used, the number of optical assemblies can be lessened and the device can be miniaturized and simplified. Furthermore, an alignment required when optical assemblies are set and disposed can be made easy and stable. Therefore, it is possible to provide a highly reliable confocal scanning microscope.

While the confocal scanning microscope is described so far, the present invention is not limited to the confocal scanning microscope and information of a certain section surface of a target object can be obtained by use of the two-dimensional optical device array.

If an optical system similar to the above-mentioned microscope processes an optical disk as a target object, then it is possible to obtain an optical recording and reproducing apparatus which can read and write two-dimensional or three-dimensional information at high speed.

Figure 14:
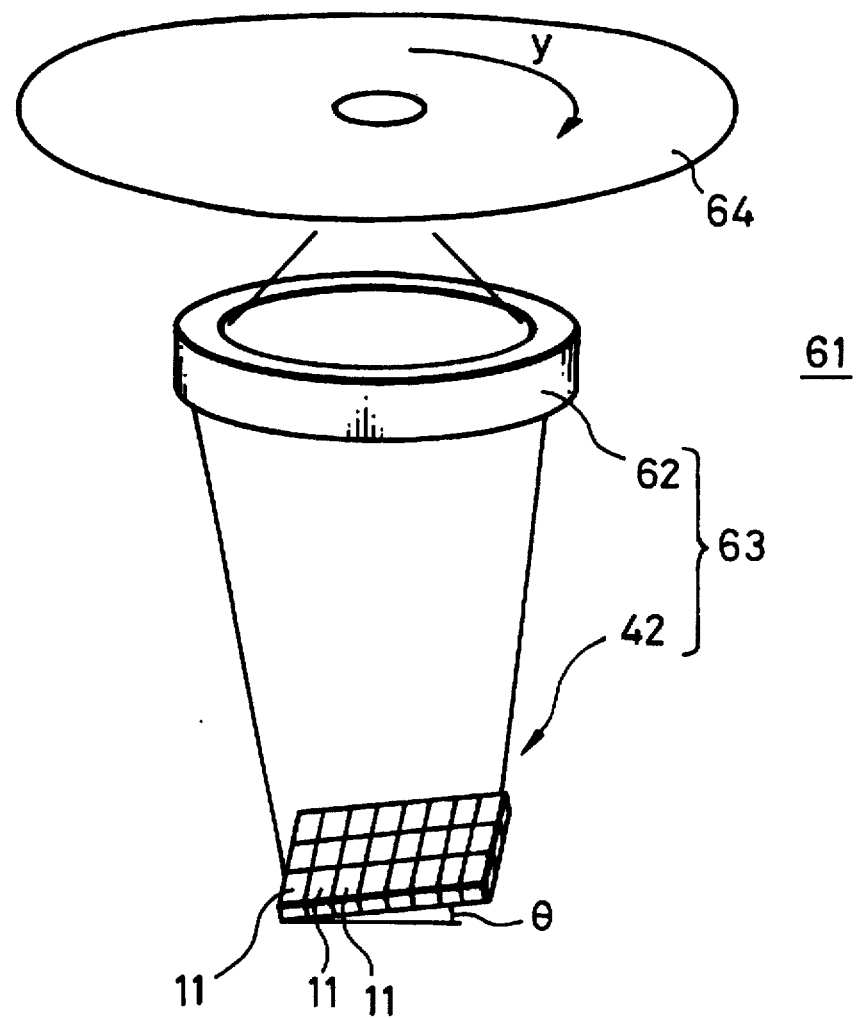
FIG. 14 is a perspective view showing an optical recording and reproducing apparatus according to a first embodiment of the present invention.

FIG. 14 shows an optical recording and reproducing apparatus which can optically record and reproduce three-dimensional information according to a first embodiment of the present invention.

As shown in FIG. 14, an optical recording and reproducing apparatus 61 according to this embodiment is composed of the two-dimensional optical device array 42 shown in FIG. 7, an objective lens 62 and an optical recording medium, e.g., optical disk 64. The two-dimensional optical device array 42 is disposed such that one arrangement direction of the optical devices 11 is extended along a rotational direction y of the optical disk 64 and that the whole of the two-dimensional optical device array 42 is tilted at a predetermined angle θ along the rotational direction of the optical disk 64, i.e., optical axis of emitted light $L_F$ is tilted by the angle e from the optical axis of the objective lens 62. The two-dimensional optical device array 42 and the objective lens 62 constitute an optical pickup 63.

Figure 15:
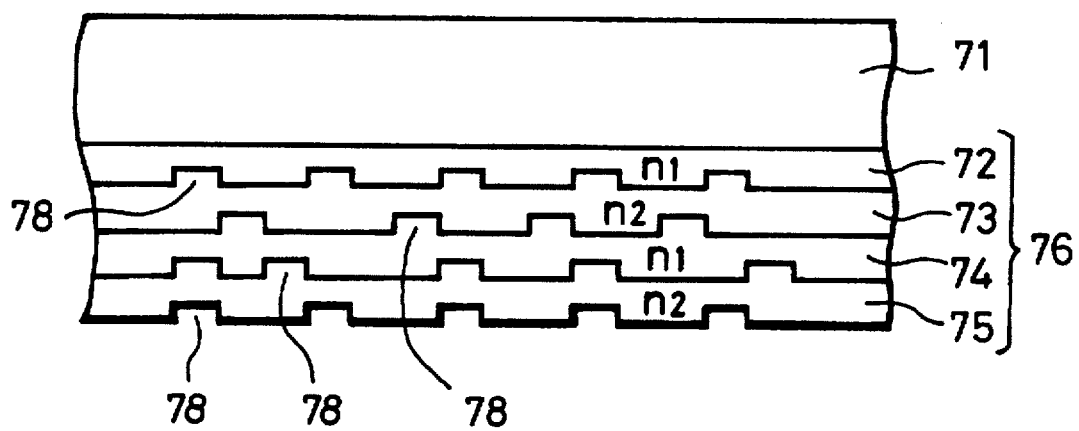
FIG. 15 is a side view showing an example of an optical disk used in the present invention.

The optical disk 64 includes a recording layer made of a material having a proper transmission and a change of reflectivity. As shown in FIG. 15, for example, in the case of a read-only (ROM) optical disk, there is formed the optical disc 64 wherein a recording layer 76 made up of a plurality of transparent recording layers 72, 73, 74, 75 each having a uniform thickness, and in which information 78 is recorded in the form of concavity and convexity the layers 72, 73, 74 and 75 are laminated on a substrate 71. In this case, a refractive index $n_1$ of every other recording layers 72, 74 and a refractive index $n_2$ of every other recording layers 73, 75 are made different from each other ($n_1 \neq n_2$). The number of recording layers of the optical disk 64 used in the optical recording and reproducing apparatus 61 shown in FIG. 14 corresponds to the number of optical devices 11 arranged in the direction extended along the optical disk rotational direction y of the two-dimensional optical device array 42.

Figure 16:
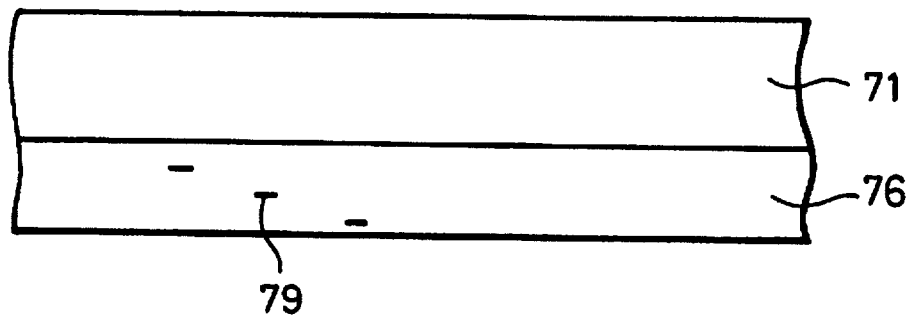
FIG. 16 is a side view showing another example of an optical disk used in the present invention.

Further, as the optical disk 64, there is formed an optical disk wherein a recording layer 76 formed by a combination of various photosensitive materials to record information 79 based on chemical changes of materials is formed on the substrate 71 as shown in FIG. 16.

On the optical disk 64, there are parallelly formed spiral recording tracks the number of which corresponds to the number of optical devices 11 arranged in the direction perpendicular to the rotational direction y of the optical disk 64 of the two-dimensional optical device array 41.

According to the optical recording and reproducing apparatus 61, information 78 whose number corresponds to the number of n (vertical direction) x m (horizontal direction) optical devices of the two-dimensional optical device array 42 can be parallelly read out from the optical disk 64 shown in FIG. 15, for example, by servo-controlling the optical device 11 located at the central portion of the two-dimensional optical device array 42. Also, information 78 of the laminated recording layers 72, 73, 74, 75 can be read out simultaneously, i.e., three-dimensional information can be read out from the optical disk 64.

Further, if the optical disk 64 shown in FIG. 16 is used, information can be optically recorded on the optical disk 64 by the optical pickup 63 in a three-dimensional fashion. Also, it becomes possible to read out the information 79 optically recorded on the optical disk 64 by the same optical system, i.e., optical pickup 63.

The optical recording and reproducing apparatus 61 can read out and write three-dimensional information on and from the optical disk 64 by using the two-dimensional optical device array 42 at high speed.

Figure 17:
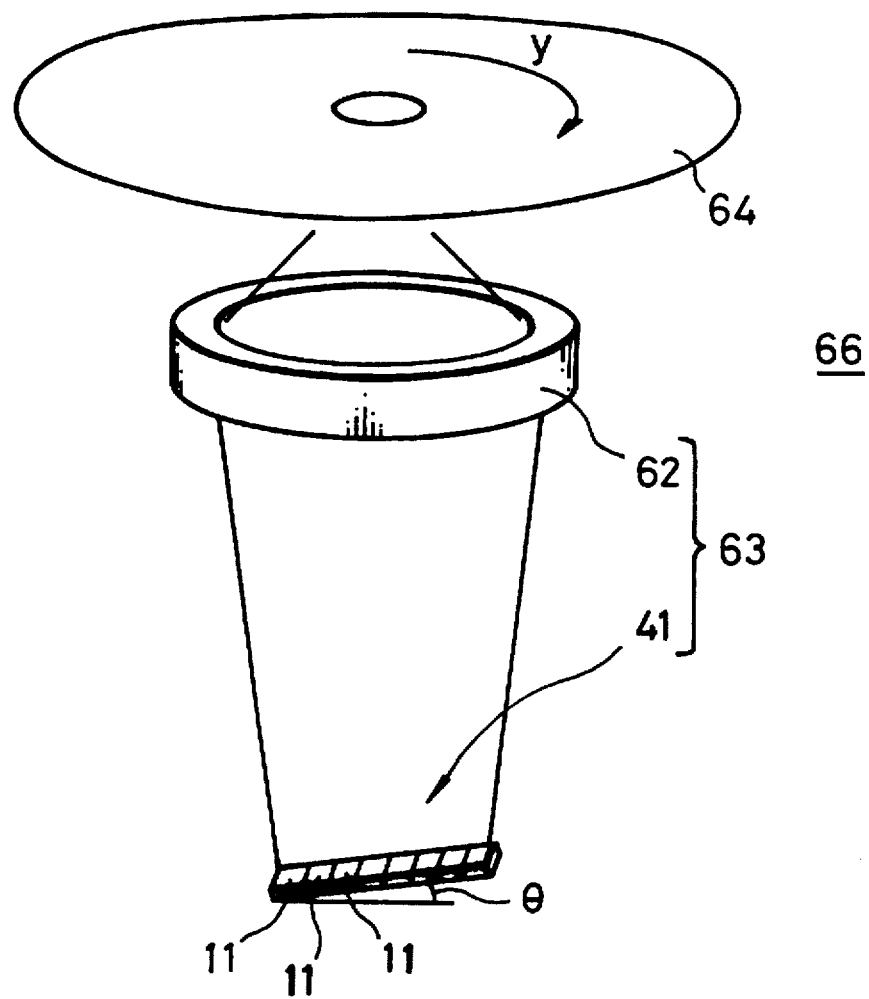
FIG. 17 is a perspective view showing an optical recording and reproducing apparatus according to a second embodiment of the present invention.

FIG. 17 shows an optical recording and reproducing apparatus 66 according to a second embodiment of the present invention. As shown in FIG. 17, the optical recording and reproducing apparatus 66 includes the one-dimensional optical device array 41 shown in FIG. 6, the objective lens 62 and the optical disk 64. The optical recording and reproducing apparatus 66 is disposed such that the one-dimensional optical device array 41 is disposed along the rotational direction y of the optical disk 64 and that the whole of the one-dimensional optical device array 41 is tilted at a predetermined angle θ along the optical disk rotational direction y.

While the optical disks shown in FIGS. 15 and 16 can be applied to the optical disk 64 shown in FIG. 17, the number of recording layers corresponds to the number of optical devices. Moreover, the recording track is formed as a single spiral-shaped recording track.

The optical recording and reproducing apparatus 66 can parallelly read out information whose number corresponds to the number of optical devices of the one-dimensional optical device array 41, i.e., information corresponding to each recording layer formed in the depth direction of the optical disk 64 or write/read information with the result that three-dimensional information can be read out from and written in the optical disk 64 at high speed.

Figure 18:
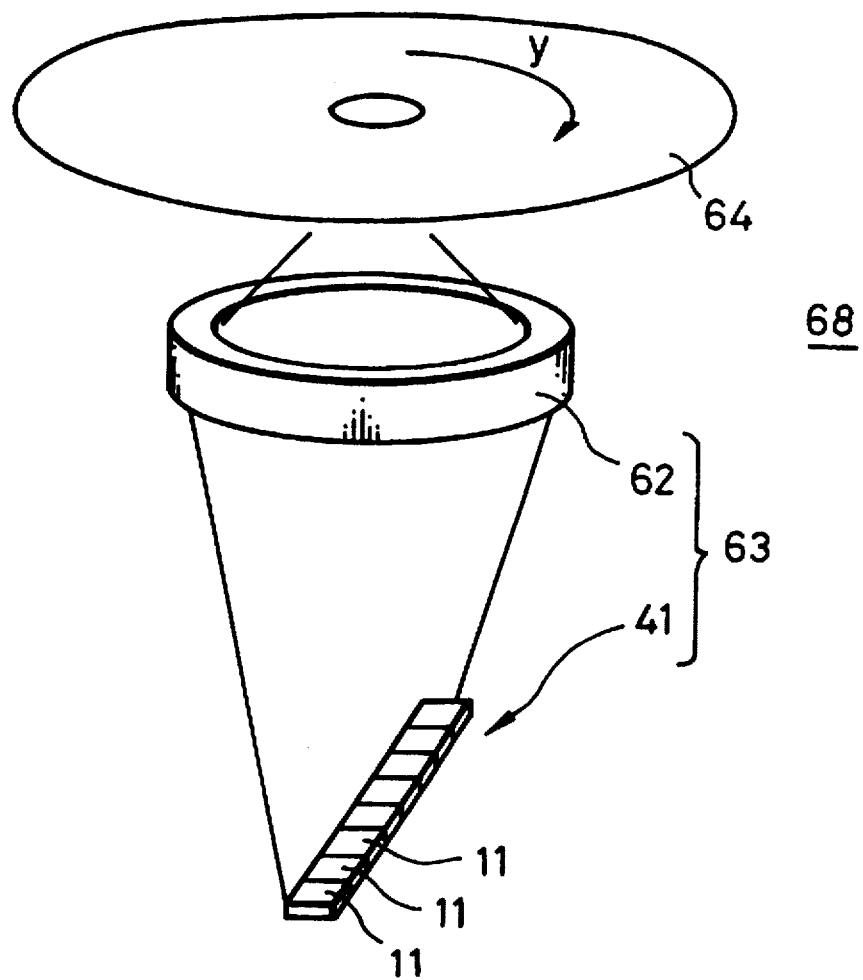
FIG. 18 is a perspective view showing an optical recording and reproducing apparatus according to a third embodiment of the present invention.

FIG. 18 shows an optical recording and reproducing apparatus according to a third embodiment of the present invention. As shown in FIG. 18, an optical recording and reproducing apparatus 68 according to this embodiment includes the one-dimensional optical device array 41, the objective lens 62 and the optical disk 64 wherein the one-dimensional optical device array 41 is disposed at a right angle of the rotational direction y of the optical disk 64. The optical disk 64 has spiral-shaped parallel recording tracks the number of which corresponds to the number of optical devices of the one-dimensional optical device array 41.

According to the optical recording and reproducing apparatus 68, the one-dimensional optical device array 41 can obtain information of the number corresponding to the number of the optical devices 11 from the optical disk 64 parallelly and read out or write two-dimensional information from or in the optical disk 64 at high speed.

The above-mentioned optical recording and reproducing apparatus can use the two-dimensional or one-dimensional optical device array 41 or 42 of the arrangement shown in FIG. 9, though not shown.

According to the above-mentioned optical recording and reproducing apparatus, it is possible to parallelly process two-dimensional or three-dimensional information of the optical disk. Further, since the optical device array 41 or 42 based on the optical device 11 wherein the light-emitting portion 14 and the light-receiving portion 15 are integrally formed is used in the optical recording and reproducing apparatus, the number of optical assemblies can be lessened and the apparatus can be miniaturized and simplified. Further, an alignment required when the optical assemblies are set can be made easy and stable. Therefore, it is possible to provide an optical recording and reproducing apparatus which is high in reliability.

If the one-dimensional or two-dimensional optical device array 41 or 42 which becomes a base of the present invention is used as various sensors, then such one-dimensional or two-dimensional optical device array 41 or 42 can be widely used as base assemblies for information processing.

According to the confocal microscope of the present invention, the two-dimensional or three-dimensional information from the target object can be parallelly processed at high speed. Further, the confocal microscope according to the present invention can be miniaturized and simplified. In addition, an alignment required when the optical system is set can be made easy and stable. Therefore, it is possible to provide a confocal microscope which is highly reliable.

Further, according to the optical recording and reproducing apparatus of the present invention, two-dimensional or three-dimensional information can be optically recorded and reproduced on and from the optical recording medium. The optically recorded and reproduced information can be parallelly processed at high speed. Moreover, the optical recording and reproducing apparatus itself can be miniaturized and simplified. Furthermore, an alignment required when the optical system is set can be made easy and stable. Therefore, it is possible to provide an optical recording and reproducing apparatus which is highly reliable.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A confocal microscope comprising:

an array of optical coupling devices arranged on a common substrate, said array operatively positioned for confocal scanning of a target such that the target and array are moved relative to one another along a scanning direction during confocal scanning; and an objective lens;

wherein, each of said optical coupling devices comprises a light-emitting portion and a light-receiving portion operatively disposed closely on said common substrate in such a way that light originating from said light-emitting portion is emitted through said objective lens to said target and light reflected from said target is reflected back through said objective lens and is received and detected near a confocal position by said light-receiving portion, at least part of said light-receiving portion being located within a light diffraction limit of said light emitting portion, said objective lens converging said emitted light onto said target and converging said reflected light onto said light receiving portion, and said array produces signals providing at least two-dimensional information about said target.

2. A confocal microscope according to claim 1, wherein said light-emitting portion comprises a semiconductor laser and a reflecting mirror and said light-receiving portion comprises a photodiode.

3. A confocal microscope according to claim 1, wherein said optical coupling devices are arranged on said common substrate at a predetermined interval.

4. A confocal microscope according to claim 3, wherein said predetermined interval is about 500 μm.

5. A confocal microscope according to claim 1, wherein said optical coupling device array is aligned in parallel to a scanning direction of said target object and titled at a predetermined angle along said scanning direction.

6. A confocal microscope according to claim 1, wherein said optical coupling device array is disposed such that an optical axis of light emitted from said optical coupling device coincides with an optical axis of said objective lens.

7. The confocal microscope of claim 1, wherein each of said light receiving portions of said optical coupling devices being located at a position wherein a distance between the optical axis of the light emitting portion and light emitted from the respective light emitting portion intersecting a light receiving portion surface layout reference plane falls within $1.22 \lambda/NA$, where $\lambda$ is the wavelength of the emitted light and NA is the numerical aperture of the objective lens.

8. The confocal microscope of claim 1, wherein said array is aligned at a right angle with respect to a scanning direction.

9. The confocal microscope of claim 1, wherein said array is aligned along said scanning direction.

10. The confocal microscope of claim 1, wherein adjacent optical coupling devices are configured to emit and receive light of different polarizations thereby to reduce cross talk adjacent optical coupling devices.

11. The confocal microscope of claim 1, wherein light emitted by adjacent optical coupling devices is subject to different signal regulation thereby to reduce cross talk between adjacent optical coupling devices.

12. The confocal microscope of claim 1, wherein said array is a one-dimensional array with optical coupling devices aligned along one direction.

13. The confocal microscope of claim 1, wherein said array is a two-dimensional array with a plurality of optical coupling devices aligned along each of two directions.

14. The confocal microscope of claim 1, wherein said array produces signals providing three-dimensional information about said target.

* * * * *